United States Patent
Dascher

(10) Patent No.: US 9,618,599 B2
(45) Date of Patent: Apr. 11, 2017

(54) CHARACTERIZATION AND CORRECTION OF VOLTAGE PROBE, CURRENT PROBE AND CABLE

(75) Inventor: David Dascher, Colorado Springs, CO (US)

(73) Assignee: Keysight Technologies, Inc., Santa Rose, CA (US)

(*) Notice: Subject to any disclaimer, the term of this patent is extended or adjusted under 35 U.S.C. 154(b) by 1490 days.

(21) Appl. No.: 13/247,568

(22) Filed: Sep. 28, 2011

(65) Prior Publication Data

US 2013/0076372 A1 Mar. 28, 2013

(51) Int. Cl.
*G01R 35/00* (2006.01)

(52) U.S. Cl.
CPC .................. *G01R 35/00* (2013.01)

(58) Field of Classification Search
CPC ..... G01R 1/06788; G01R 1/067; G01R 35/00
USPC .......... 324/600, 601, 616, 617, 637, 754.01, 324/72.5
See application file for complete search history.

(56) References Cited

U.S. PATENT DOCUMENTS

| | | | | |
|---|---|---|---|---|
| 2,883,619 | A * | 4/1959 | Kobbe et al. | 324/72.5 |
| 4,063,549 | A * | 12/1977 | Beretsky et al. | 600/443 |
| 5,175,492 | A * | 12/1992 | Wong et al. | 324/74 |
| 5,231,349 | A * | 7/1993 | Majidi-Ahy et al. | 324/754.06 |
| 6,856,126 | B2 * | 2/2005 | McTigue et al. | 324/72.5 |
| 6,870,359 | B1 * | 3/2005 | Sekel | 324/750.02 |
| 7,180,314 | B1 * | 2/2007 | Sekel | 324/750.02 |
| 8,319,502 | B2 * | 11/2012 | Hashimshony et al. | 324/601 |
| 2004/0140819 | A1 * | 7/2004 | McTigue et al. | 324/720 |
| 2007/0041511 | A1 * | 2/2007 | Tan et al. | 379/30 |
| 2008/0048673 | A1 * | 2/2008 | Tan et al. | 324/601 |
| 2008/0059092 | A1 * | 3/2008 | Pupalaikis et al. | 702/66 |
| 2008/0278176 | A1 * | 11/2008 | Hagerup | G01R 27/32 324/601 |
| 2009/0167332 | A1 * | 7/2009 | Forbes | 324/754 |
| 2010/0277190 | A1 * | 11/2010 | Reichel et al. | 324/754.11 |
| 2011/0074389 | A1 * | 3/2011 | Knierim et al. | 324/76.39 |

* cited by examiner

*Primary Examiner* — Patrick Assouad
*Assistant Examiner* — Haidong Zhang

(57) ABSTRACT

Responses of voltage and current probes are characterized or corrected. A voltage probe method includes measuring output of the voltage probe and a first output of a through, in response to an input signal applied to the through, with the voltage probe connected, measuring a second output of the through with the voltage probe disconnected, and characterizing the response of the voltage probe using the output of the voltage probe and the first and/or second outputs. A current probe method includes measuring output current of the current probe and first output current of a through, in response to an input signal applied to the through with the current probe connected in series, measuring second output current of the through with the current probe disconnected, and characterizing the response of the current probe using the output current of the current probe and the first and/or second output currents of the through.

13 Claims, 9 Drawing Sheets ated using frequency domain measurements made with a Vector Network Analyzer (VNA). Once characterized, imperfections in the respective responses are conventionally removed from subsequent measurements by constructing simulation models based on the VNA measurements, and combining the simulation models with models for the circuits being probed. Simulations may be run using the combined simulation and circuit models by importing waveforms made with the voltage probe, the current probe or the cable. The process of characterizing the input impedances and responses of the voltage and current probes, and the transmitted response of the cable, is difficult and time consuming. Also, many users may not have the necessary equipment.

CHARACTERIZATION AND CORRECTION OF VOLTAGE PROBE, CURRENT PROBE AND CABLE

BACKGROUND

Input impedances and responses of voltage and current probes, as well as transmitted response of a cable, are typically characterized using frequency domain measurements made with a Vector Network Analyzer (VNA). Once characterized, imperfections in the respective responses are conventionally removed from subsequent measurements by constructing simulation models based on the VNA measurements, and combining the simulation models with models for the circuits being probed. Simulations may be run using the combined simulation and circuit models by importing waveforms made with the voltage probe, the current probe or the cable. The process of characterizing the input impedances and responses of the voltage and current probes, and the transmitted response of the cable, is difficult and time consuming. Also, many users may not have the necessary equipment.

Therefore, there is a need to simplify the task of characterizing the input impedances and responses of voltage and current probes, and also to simplify the task of correcting imperfections in the respective responses during subsequent measurements, e.g., without the need of a VNA, external circuit simulators or other additional equipment. Similarly, there is a need to simplify the task of characterizing the transmitted response of a cable, and correcting imperfections in the transmitted response during subsequent measurements made using the cable.

SUMMARY

In a representative embodiment, a method is provided for at least one of characterizing and correcting a response of a voltage probe. The method includes measuring an output of the voltage probe and a first output of a through, in response to an input signal applied to the through, with the voltage probe connected to a probe point of the through; measuring a second output of the through in response to the input signal, with the voltage probe disconnected from the probe point; and characterizing the response of the voltage probe using the measured output of the voltage probe and at least one of the measured first output and the measured second output of the through.

In a further representative embodiment, a method is provided for at least one of characterizing and correcting a response of a current probe. The method includes measuring output current of the current probe and first output current of a through, in response to an input signal applied to the through with the current probe connected in series; measuring second output current of the through in response to the input signal, with the current probe disconnected from the through; and characterizing the response of the current probe using the measured output current of the current probe and at least one of the measured first output current and the measured second output current of the through.

In a still further representative embodiment, a method is provided for at least one of characterizing and correcting a response of a cable. The method includes measuring an output of the cable, in response to an input signal applied to the cable, using an oscilloscope channel; measuring the input signal using the oscilloscope channel with the input signal applied to the oscilloscope channel; characterizing a transmitted response of the cable using the measured output of the cable and the measured input signal; and correcting the transmitted response of the cable by applying a correction filter based on an ideal frequency response and the transmitted response of the cable.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Figure 1:
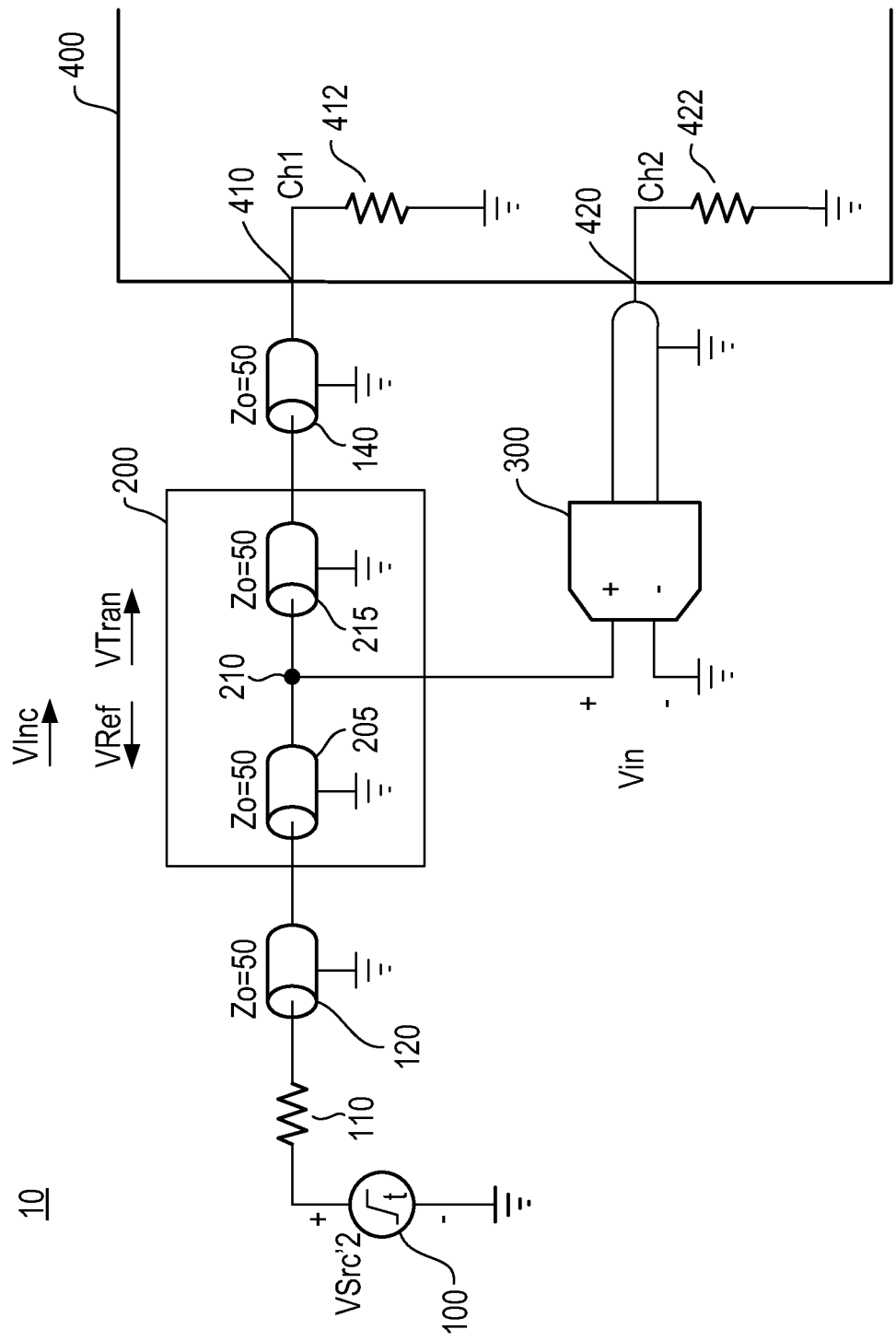
FIG. 1 is a block diagram illustrating a system for characterizing the input impedance and response of a voltage probe, according to a representative embodiment.

FIG. 1 is a block diagram illustrating a system for characterizing the input impedance and response of a voltage probe according to a representative embodiment. A first part of the procedure implemented by the system characterizes the input impedance and the response of the voltage probe, and a second part of the procedure corrects imperfections in the measured response of the voltage probe according to a representative embodiment.

As shown in FIG. 1, the system 10 includes signal generator 100 that generates an input signal. In an embodiment, the signal generator 100 is a step generator that generates a step output having a fast transition from one voltage to another voltage in short period of time, which may be referred to as a step signal. For convenience of explanation, the input signal assumed to be a step signal throughout the following description, although it is understood that any time domain signal may be used as the input signal in various embodiments, without departing from the scope of the present teachings, as long as the time domain signal contains sufficient spectral content throughout the frequency range to be corrected. For example, the input signal may be a fast impulse signal instead of a fast step signal. The step signal of signal generator 100 is denoted as having amplitude VSrc*2, and is shown as having a 50Ω generator impedance indicated as resistance 110. Signal generator 100 may be any type of generator capable of providing a step signal, and may be integrated as part of or separate from an oscilloscope, for example. The step signal may include a fast calibration step typically output from an oscilloscope, for example. The input signal provided by the signal generator 100 is connected as an input to transmission line 120, which in a representative embodiment may be a 50Ω cable, for example.

The output of transmission line 120 is connected to the input of through 200, which may be a probeable 50Ω transmission line, for example. Of note, since signal generator 100 has 50Ω generator impedance as shown and drives transmission line 120 which may be a 50Ω cable, the step signal provided to through 200 has amplitude VSrc, which is half the amplitude of the step signal as output from signal generator 100. Through 200 includes a front-end transmission line 205 and a back-end transmission line 215 that may be 50Ω microstrip lines or traces, for example. Between front-end and back-end transmission lines 205 and 215 of through 200 is probe point 210, which may be probed using voltage probe 300. Voltage probe 300 may be any typical voltage probe, and may include a first point that makes physical contact with a signal to be measured and a second point that makes physical contact to ground.

The output of through 200 is connected to transmission line 140, which may also be a 50Ω cable. The output of transmission line 140 is connected to a first channel input 410 for a first oscilloscope channel of oscilloscope 400, and the output of voltage probe 300 is connected to a second channel input 420 for a second oscilloscope channel of oscilloscope 400. Both scope the first and second channel inputs 410 and 420 of oscilloscope 400 may be terminated by 50Ω impedances as respectively denoted by resistances 412 and 422. Oscilloscope 400 may be any typical oscilloscope. The impedances may vary in various implementations, although all of the impedance must be the same impedance.

Accordingly, the step signal provided by signal generator 100 is thus connected through 50Ω transmission line 120 to 50Ω through 200, which is connected to a 50Ω first channel input 410 of oscilloscope 400. Through 200 exposes the step signal, allowing voltage probe 300 to make contact with the step signal, while maintaining constant 50Ω impedance from the input to the output of through 200. The initial analysis of this setup which will follow, assumes that all transmission lines, and source and load impedances are ideal.

In accordance with the system shown in FIG. 1, in order to measure the input impedance of voltage probe 300, voltage probe 300 is connected to probe point 210 of through 200. In response to the step signal provided to through 200 via transmission line 120, three voltage waveforms of interest exist at probe point 210, each of which has a corresponding direction indicated by arrows in FIG. 1. The three voltage waveforms include incident waveform VInc, transmitted waveform VTran, and reflected waveform VRef. Of note, the waveform VIn at the input of voltage probe 300 is identical to the transmitted waveform VTran. Since the system 10 is a terminated 50Ω system, the waveform output from transmission line 140 to first channel input 410 is identical to the transmitted waveform VTran, except that it is delayed in time. The waveform provided to first channel input 410 is a delayed view of input waveform VIn, which is at the input of voltage probe 300. The waveform provided to second channel input 420 is the probe output waveform VOut. Accordingly, when voltage probe 300 is connected to through 200 in the system 10 as shown in FIG. 1, oscilloscope 400 provides a measured output of through 200 via first channel input 410 and a measured output of voltage probe 300 via second channel input 420, in response to the step signal provided by signal generator 100.

To complete the process of measuring the input impedance of voltage probe 300, the output of through 200 is also measured via first channel input 410 responsive to the step signal input to through 200 via transmission line 120, while voltage probe 300 is disconnected from probe point 210 of through 200. In this case, since the set up is a terminated 50Ω system, transmitted waveform VTran will be equal to incident waveform VInc, and reflected waveform VRef will be equal to zero. Accordingly, when voltage probe 300 is disconnected from probe point 210 of through 200 in the system 10 as shown in FIG. 1, oscilloscope 400 provides a measured output of through 200 via first channel input 410 that is identical to the incident waveform VInc responsive to the step signal provided by signal generator 100, except that the it is delayed in time. The time delay of the measured incident waveform VInc is identical to the time delay of the input waveform VIn.

In this representative embodiment, the measurements with voltage probe 300 disconnected from probe point 210 of through 200 are made after the measurements made with voltage probe 300 connected to probe point 210 of through 200. However, it should be understood that in the alternative, the measurements with voltage probe 300 disconnected from probe point 210 of through 200 can be made before the measurements made with voltage probe 300 connected to probe point 210 of through 200, without departing from the scope of the present teachings.

The input impendence and frequency response of the voltage probe 300 can then be determined by calculating the fast Fourier transform (fft) of the impulse response of each waveform measured by system 10, whereby impulse response is determined from the derivative of step response. Hence, from the time domain measurements of the input and output waveforms VIn and VOut responsive to the step signal while voltage probe 300 was connected to probe point 210 of through 200, and from the time domain measurement of the incident waveform VInc responsive to the step signal while voltage probe 300 was disconnected from probe point 210 of through 200, the following frequency domain quantities may be indicated as follows:

$$VIncF = \mathit{fft}(\mathrm{derivative}(VInc)) \tag{1}$$

$$VInF = \mathit{fft}(\mathrm{derivative}(VIn)) \tag{2}$$

$$VOutF = \mathit{fft}(\mathrm{derivative}(VOut)) \tag{3}$$

Thereafter, denoting the input impedance of the voltage probe 300 to be ZInV and analyzing the system 10 shown in FIG. 1, the voltage VInF at the input of voltage probe 300 may be represented as:

$$VInF = 2*VIncF*(Zo\|ZInV)/(Zo\|ZInV+Zo) \quad (4)$$

In Equation (4), Zo is the characteristic impedance of the system 10 (in this case 50Ω) and the symbol || means "in parallel with". In other words, (Zo||ZInV) is the parallel combination of Zo and ZInV, and can be expressed as follows:

Solving Equation (4) for the input impedance ZInV of the voltage probe 300 provides as follows:

$$ZInV = Zo/2*VInF/(VIncF-VInF) \quad (6)$$

Accordingly, the input impedance ZInV of the voltage probe 300 may be determined from the measured incident waveform VInc responsive to the step signal with the voltage probe 300 disconnected from probe point 210 of through 200, and the measured input waveform VIn (which is identical to VTran) made in response to the step signal with the voltage probe 300 connected to probe point 210 of through 200. The input impedance ZInV of the voltage probe 300 can thus be characterized without the need of a VNA.

The response of voltage probe 300 may then be determined, as described below.

In general, in some cases a user may consider a first voltage probe, which reproduces a signal at the input of the voltage probe while the voltage probe is loading the signal, as ideal. Specifically, the input impedance of a voltage probe forms a voltage divider with the source impedance of the system being probed, and thus attenuates the source voltage, which is commonly referred to as loading the signal being probed. That is, the voltage probe slightly alters or changes the signal being probed. The waveform at the output of a voltage probe is identical to the waveform at the input of the voltage probe, even if the voltage probe has non-ideal (non-infinite) input impedance. Accordingly, the goal of such a first voltage probe is to reproduce the slightly altered or changed waveform provided at its input.

In contrast, in other cases a user may consider a second voltage probe that compensates for the loading of the voltage probe by boosting the transfer function of the voltage probe by the amount that the voltage probe loads the signal as ideal. Such a voltage probe produces an output waveform that is identical to the waveform that is incident to the point being probed.

The transfer function of a voltage probe VprbTF is, by definition, as follows:

$$VprbTF = VOutF/VInF \quad (7)$$

The transfer function of a voltage probe is completely defined by the properties of the voltage probe and is not affected by any characteristics of the system being probed. In contrast, a response from a so-called system standpoint (system response) SysTF may be defined as follows:

$$SysTF = VOutF/VSrcF = VOutF/VIncF \quad (8)$$

In this case, the system is a function of both the properties of the voltage probe, and also of the system being probed. That is, as described, the input impedance of the voltage probe forms a voltage divider with the source impedance of the system being probed and hence attenuates the source voltage, loading the signal being probed.

In terms of the probe transfer function, the system response SysTF may be defined as follows:

$$SysTF = VOutF/VIncF \quad (9)$$
$$= (VInF*VprbTF)/VIncF$$
$$= VprbTF*VInF/VIncF$$

After solving for VInF/VIncF in equation (4), and substituting accordingly into equation (9), the system response SysTF may be simplified as follows:

$$SysTF = VprbTF*ZInV/(ZInV+Zo/2) \quad (10)$$

When the input impedance of a voltage probe is ideal (infinite), the waveform that is incident to the voltage probe is identical to the waveform that appears at the input of the voltage probe, and thus there is no difference between these two responses, i.e., between the probe transfer function and the system response. Accordingly, as may be seen from the above, the input impedance and response of the voltage probe 300 may be characterized by three measurements, including the measured incident waveform VInc, input waveform VIn, and output waveform VOut.

In order to accommodate whichever definition of response that a user of a voltage probe might want to idealize, either of the above two responses can be calculated and corrected. Either the transfer function of the probe VOut/VIn can be made to be ideal, or the system response VOut/VInc=VOut/VSrc can be made to be ideal. Regardless of which response is to be corrected, it is necessary to consider and define the shape of an ideal frequency response IdealF.

In general, when the spectral content of a signal is fully contained within a given bandwidth, then the signal can be identically reproduced by a measurement system that has a flat magnitude and a flat (linear) phase response across the same bandwidth. Similarly, a measurement system that does not have both a flat magnitude and a flat phase response across the bandwidth will not provide an identical reproduction of the signal being measured. The ideal response of a measurement system therefore has a flat magnitude and a flat phase across the entire bandwidth of the measurement system.

Accordingly, the definition of an ideal response would be a low pass response with flat magnitude and flat phase across the bandwidth of the system, which approximates a low pass filter with linear phase. The useful degrees of freedom include the corner frequency and the number of poles, which determine the slope of the above-band roll off. As an example, to achieve an ideal low pass response that has a corner frequency Fc=30 GHz with an N_Poles=20 roll-off and linear phase, the ideal frequency response IdealF can be defined as follows:

In Equation (11), sqrt means "the square root of", Fc is the corner frequency, Freq is frequency:

$$IdealF = 1/sqrt(1+(Freq/Fc)^{\wedge}(2*N\_Poles))) \quad (11)$$

Given the ideal frequency response IdealF, a correction filter can be calculated in one of two different ways, depending on which response is to be corrected. If correcting the transfer function of the probe VprbTF=VOut/VIn, a correction filter frequency response VprbCF_F may be defined as follows:

$$VprbCF\_F = IdealF/VprbTF = IdealF*VInF/VOutF \quad (12)$$

The resistance 110 is in parallel with the resistance 412 to create 25Ω source impedance of the system. If correcting the system response of a probed system with 25Ω source impedance, which may be referred to as a doubly terminated 50Ω system such as in the system described with respect to FIG. 1, a correction filter frequency response VprbCF_F may be defined as follows:

$$VprbCF\_F = IdealF \cdot VIncF/VOutF \quad (13)$$

Additionally, if correcting the system response of a probed system with an arbitrary source impedance, where ZSrc=Zo/2, a correction filter frequency response VprbCF_F may be defined as follows:

$$VprbCF\_F = IdealF/VprbTF \cdot (ZVprb+ZSrc)/ZVprb \quad (14)$$

The desired correction filter frequency response VprbCF_F calculated as noted above in accordance with any of equations (12)-(14) can then be converted to a correction filter impulse response VprbCF_IR with an inverse fast Fourier transform (ifft) function, as follows:

$$VprbCF\_IR = ifft(VprbCF\_F) \quad (15)$$

The correction filter impulse response VprbCF_IR may be low pass filtered and then re-sampled to any required filter sample rate, to provide a finite impulse response (FIR) correction filter VprbCF_FIR defined as follows:

$$VprbCF\_FIR = \text{re-sample}(Lowpass(VprbCF\_IR)) \quad (16)$$

In Equation (16), re-sample changes the time between samples and Lowpass is a low pass filter. All subsequent outputs of the voltage probe generated responsive to connection of the voltage probe to any probed system or point may thus be corrected by filtering the measured waveform using the desired FIR correction filter.

Characterization and correction of a 30 GHz voltage probe of an example embodiment is described. It should however be understood that the characterization and correction may be applied to voltage probes other than 30 GHz voltage probes, without departing from the scope of the present teachings.

All or part of the various process operations discussed above may be implemented using a processing device, configured to execute computer software for characterizing and correcting the response of the voltage probe 300, together with a graphical user interface (GUI) for directing a user when to perform certain steps, such as connecting and disconnecting the voltage probe 300 to enable the various measurements. The processing device may be included in the oscilloscope 400, or it may be a separate device, such as a personal computer (PC) or other test instrument.

The processing device may be constructed of any combination of hardware, firmware or software architectures, and include its own memory (e.g., nonvolatile memory) for storing executable software/firmware executable code that allows it to perform the various process operations. Alternatively, the executable code may be stored in designated memory locations within a separate memory. The memory may be any number, type and combination of external and internal nonvolatile read only memory (ROM) and volatile random access memory (RAM), and stores various types of information, such as signals and/or computer programs and software algorithms executable by the processing device. The memory may include any number, type and combination of tangible computer readable storage media, such as a disk drive, an electrically programmable read-only memory (EPROM), an electrically erasable and programmable read only memory (EEPROM), a CD, a DVD, a universal serial bus (USB) drive, and the like.

The processing device may execute software code, including the GUI, stored on a computer readable storage medium in order to characterize and/or correct a response of the voltage probe 300. For example, the GUI may initially instruct the user via a display to connect the voltage probe 300 to the through 200 at the probe point 210. With the voltage probe 300 connected to the probe point 210, the processing device may measure an output of the voltage probe 300 and a first output of the through 200, in response to an input signal being applied to the through 200. The GUI may then instruct the user to disconnect the voltage probe 300 from the probe point 210. With the voltage probe 300 disconnected from the probe point 210, the processing device may measure a second output of the through 200 in response to the input signal. The processing device is then able to characterize the response of the voltage probe 300, e.g., by determining a transfer function of the voltage probe 300, using the measured output of the voltage probe 300 and at least one of the measured first output and the measured second output of the through 200. The processing may similarly correct the response of the voltage probe 300, for example, by generating a filter correction for the voltage probe 300 responsive to the measured output of the voltage probe 300 and the measured first output of the through 200, and applying the filter correction to an output of the voltage probe 300 generated in response to connection of the voltage probe 300 to a device or a system to be measured.

Figure 2:
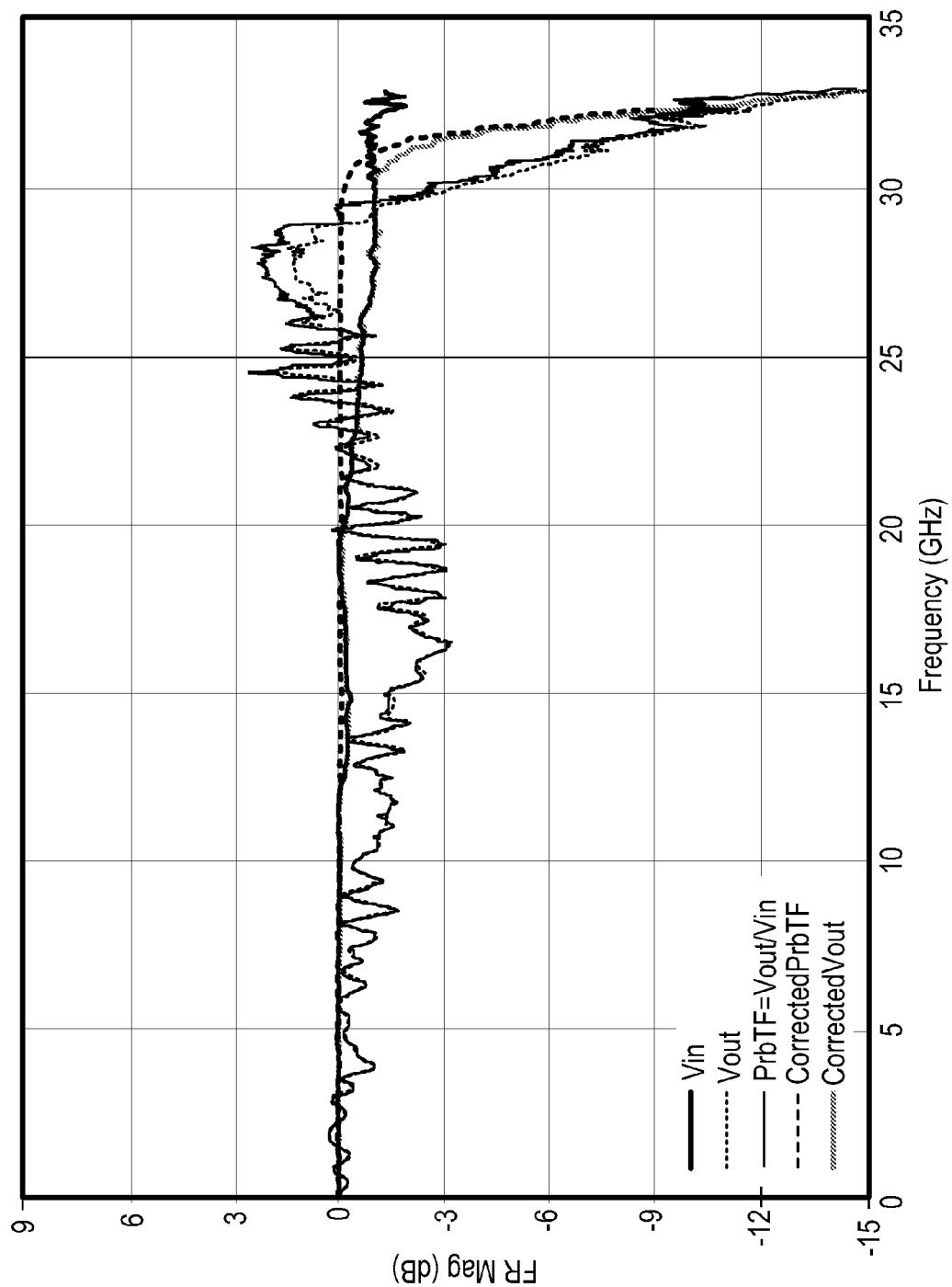
FIG. 2 illustrates a plot of the magnitude of measured voltage VInF, measured output voltage VOutF, voltage probe transfer function VprbTF, corrected voltage probe transfer function CorrectedVprbTF, and corrected probe output CorrectedVOut, each with respect to frequency, according to a representative embodiment.

FIG. 2 illustrates a plot of the magnitude of the measured input voltage VInF at the input of a voltage probe (e.g., voltage probe 300), the measured output voltage VOutF at the output of the voltage probe, the probe transfer function VprbTF=VOutF/VInF, the magnitude of the corrected probe transfer function CorrectedVprbTF, and the magnitude of the corrected voltage probe output CorrectedVOut which corresponds to the output waveform of the voltage probe as corrected by the desired FIR correction filter, each with respect to frequency. The waveforms shown in FIG. 2 were produced responsive to a step signal, such as provided by signal generator 100 described with respect to FIG. 1. As should be appreciated in view of FIG. 2, the corrected voltage probe output CorrectedVOut is shown as substantially superimposed on the measured input voltage VInF at the input of a voltage probe and only diverges above 30 GHz.

Figure 3:
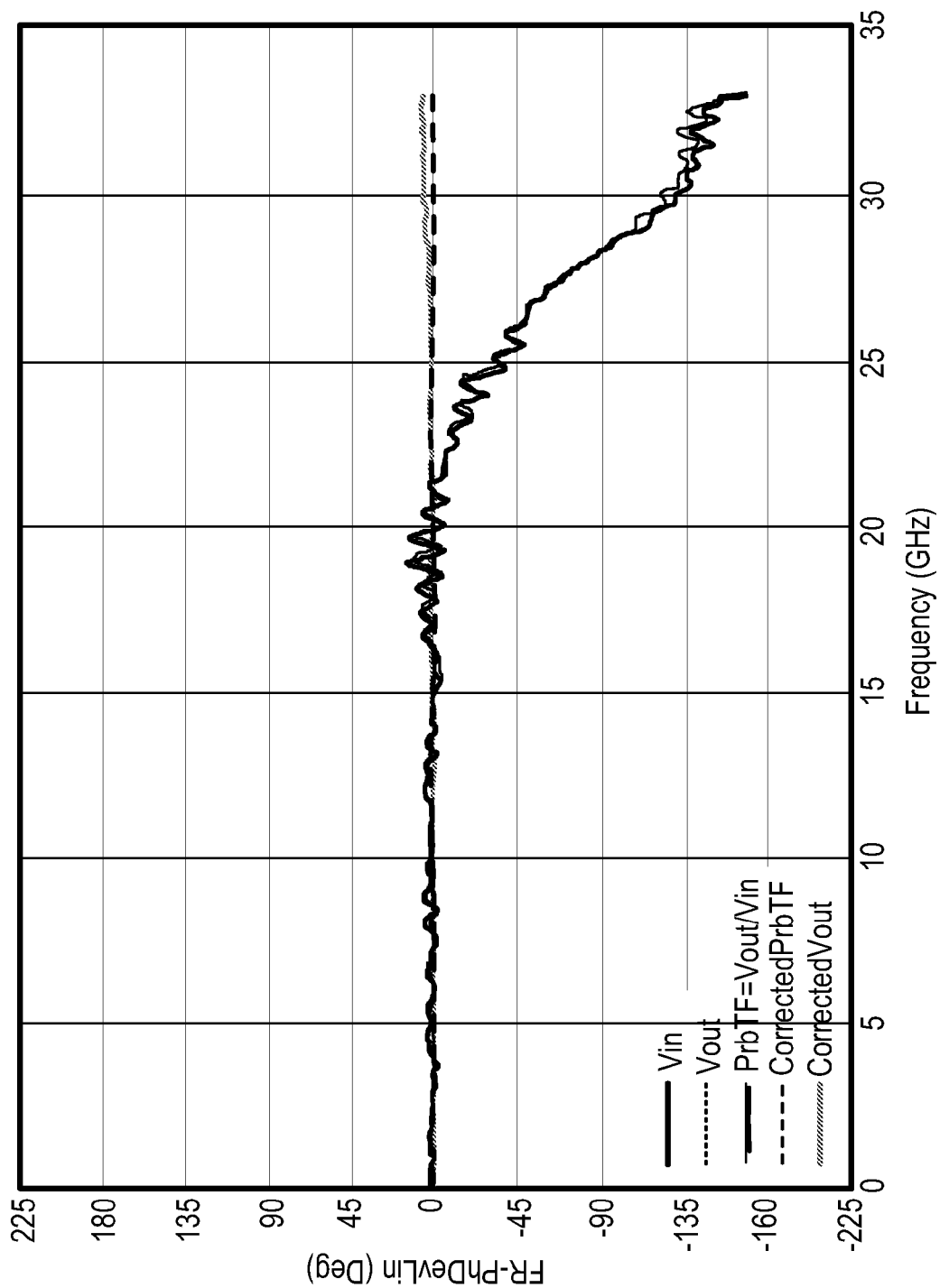
FIG. 3 illustrates a plot of deviation from linear phase of measured voltage VInF, measured output voltage VOutF, voltage probe transfer function VprbTF, corrected voltage probe transfer function CorrectedVprbTF, and corrected voltage probe output CorrectedVOut with respect to frequency, according to a representative embodiment.

FIG. 3 illustrates a plot of the deviation from linear phase of the measured input voltage VInF, the measured output voltage VOutF, the probe transfer function VprbTF, the corrected probe transfer function CorrectedVprbTF, and the corrected voltage probe output CorrectedVOut, each versus frequency. Notably, the phase of the corrected voltage probe is linear.

Figure 4:
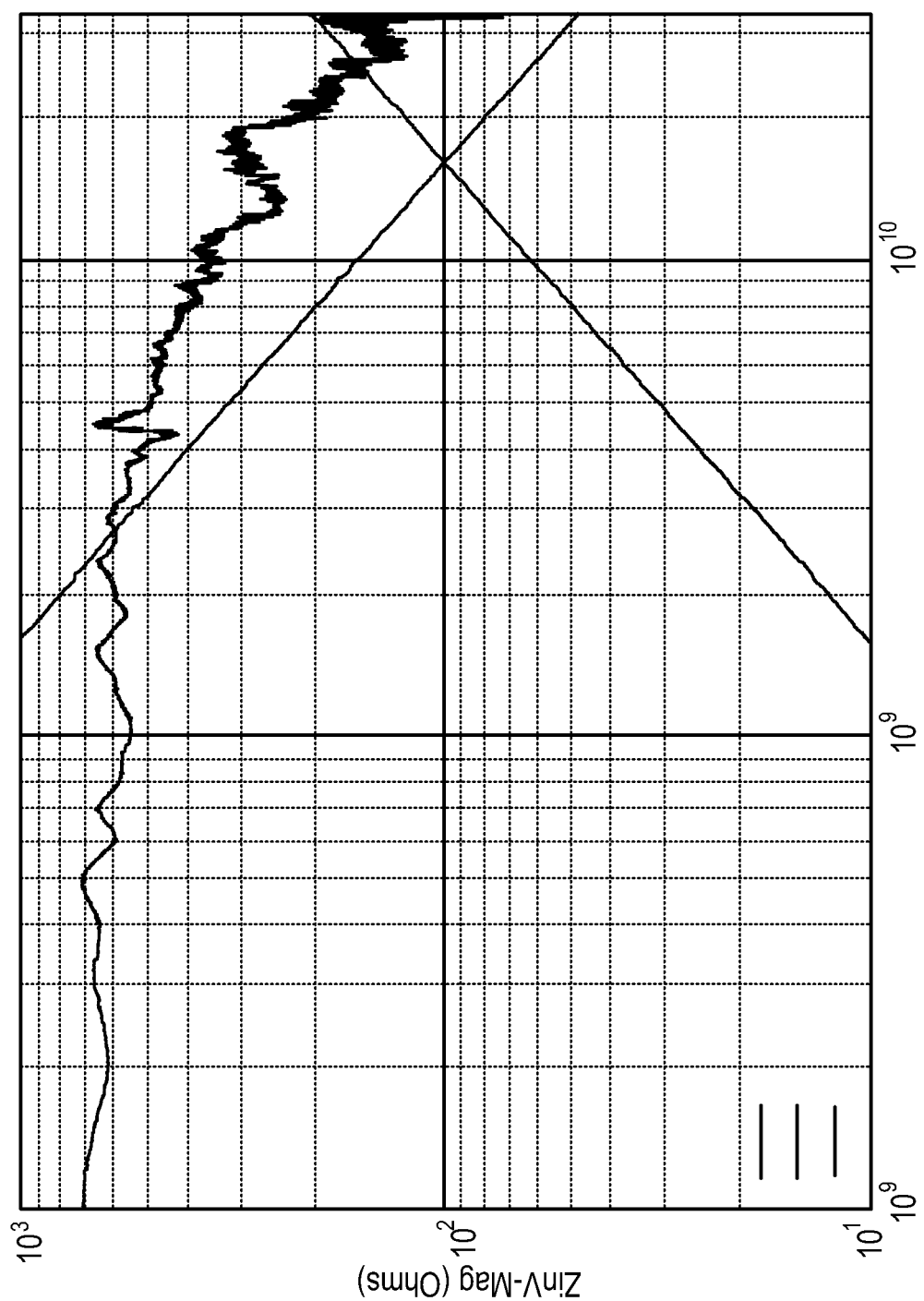
FIG. 4 illustrates a plot of the magnitude of measured input impedance of the voltage probe with respect to frequency, according to a representative embodiment.

FIG. 4 illustrates a plot of the magnitude of the measured input impedance ZinV of the voltage probe with respect to frequency. As shown, the measured input impedance ZinV of the voltage probe is resistive at relatively lower frequencies, and capacitive at relatively higher frequencies.

Figure 5:
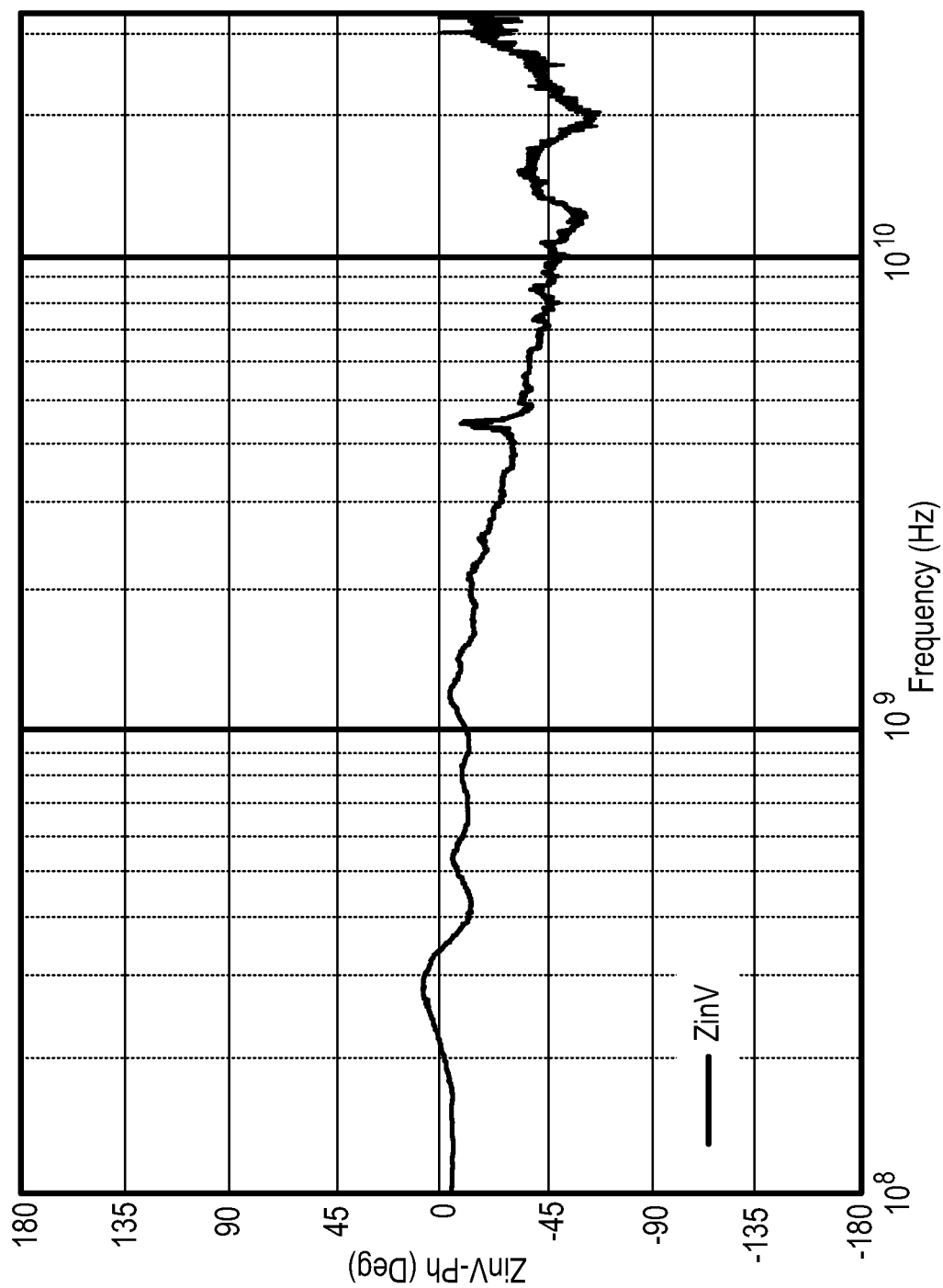
FIG. 5 illustrates a plot of the phase of the measured input impedance of the voltage probe with respect to frequency.

FIG. 5 illustrates a plot of the phase of the measured input impedance ZinV of the voltage probe with respect to frequency.

Figure 6A:
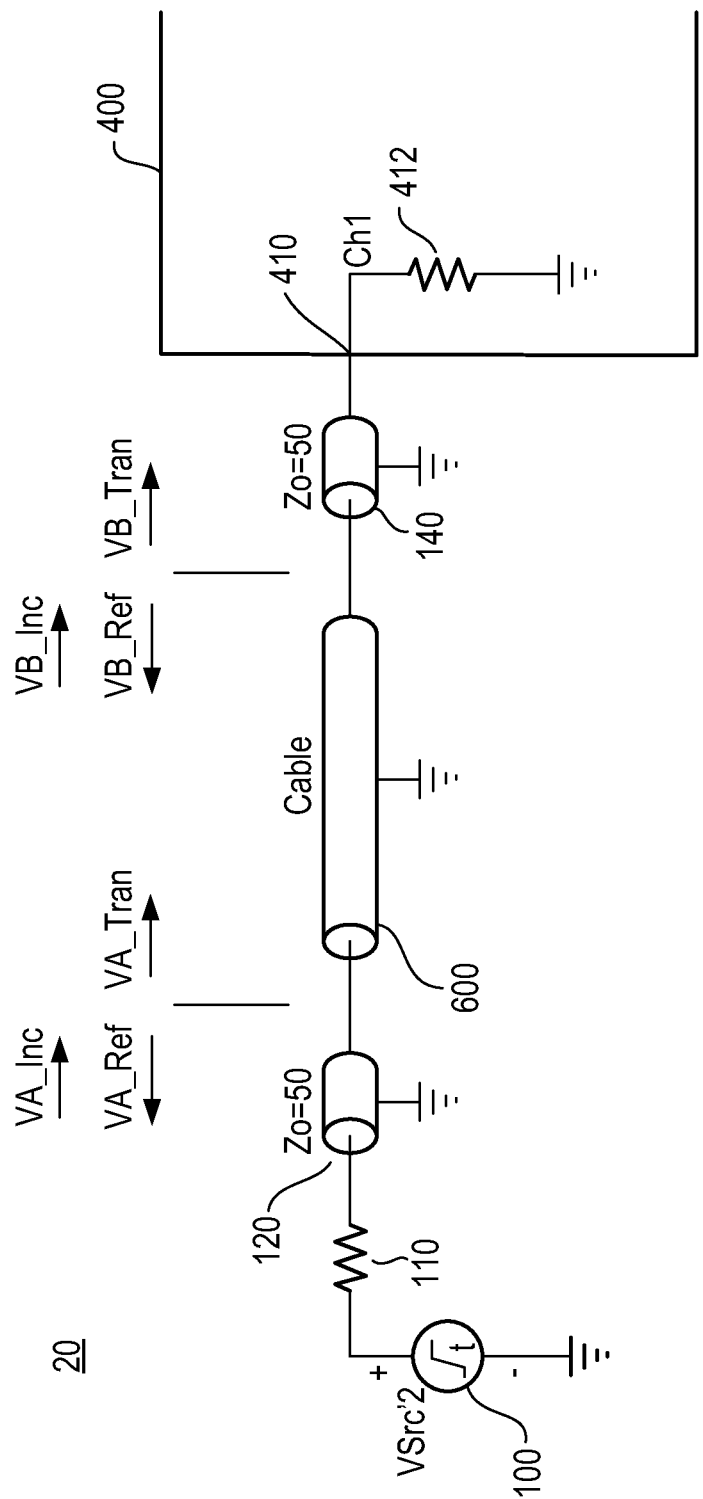
FIGS. 6A and 6B are block diagrams illustrating a set up used to characterize the transmitted response of a cable according to a further representative embodiment.
Figure 6B:
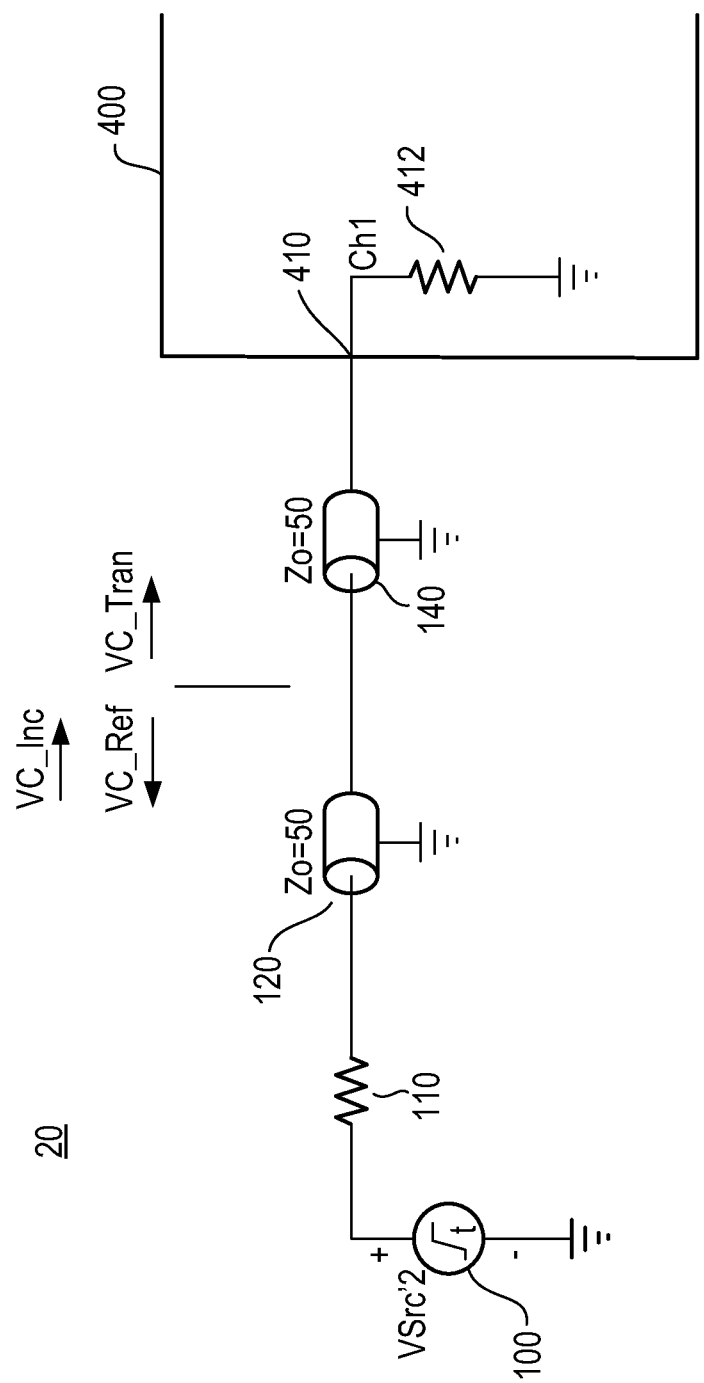

FIGS. 6A and 6B are block diagrams illustrating a set up used to characterize the transmitted response of a cable according to a further representative embodiment. In this case, the cables transmit the signal to be measured from the device that generates the signal to the instrument making the measurement.

As shown in FIG. 6A, the system 20 includes signal generator 100 shown as having a 50Ω source impedance denoted by resistance 110, transmission line 120, transmission line 140, and oscilloscope 400, which includes a first channel input 410 terminated with 50Ω impedance denoted by resistance 412. These components are the same as the corresponding components as described with respect to the system 10 shown in FIG. 1.

As further shown in FIG. 6A, cable 600 is connected to receive the output of transmission line 120. Also, an output of cable 600 is connected to transmission line 140. VA_Inc is the waveform output from transmission line 120 and incident to cable 600, waveform VA_Ref is the portion of waveform VA_Inc reflected from cable 600, and waveform VA_Tran is the portion of waveform VA_Inc transmitted into cable 600. Also, VB_Inc is the waveform output from cable 600 and incident to transmission line 140, waveform VB_Ref is the portion of waveform VB_Inc reflected from transmission line 140, and waveform VB_Tran is the portion of waveform VB_Inc transmitted into transmission line 140.

As shown in FIG. 6B, with cable 600 removed from the system 20, VC_Inc is the waveform from transmission line 120 incident to transmission line 140, waveform VC_Ref is the portion of waveform VC_Inc reflected from transmission line 140, and waveform VC_Tran is the portion of waveform VC_Inc transmitted into transmission line 140.

Using the same procedure to convert measured step responses to frequency responses as described with respect to system 10 of FIG. 1, the transmitted response (or transfer function) CblTF of cable 600 may be defined as follows, wherein VB_IncF and VA_TranF respectively correspond to the measured values of VB_Inc and VA_Tran in the frequency domain:

$$CblTF=VB\_IncF/VA\_TranF \qquad (17)$$

In detail, if the characteristic impedance Zo of cable 600 is approximately 50Ω, for example, then the waveform VA_Tran would be approximately equal to the waveform VA_Inc. The waveform VA_Inc can be measured using first channel input 410 of oscilloscope 400 by removing cable 600 from the system 20 as shown in FIG. 6B. In this case, the waveform VC_Tran equals the waveform VC_Inc, and the waveform that appears at the first channel input 410 is identical to the waveform VC_Tran except that it is delayed in time. Thus, the waveform at the first channel input 410 with cable 600 removed from the system 20 as shown in FIG. 6B is a delayed view of the waveform VA_Tran (or the input signal with the cable 600 removed from the system 20). In contrast, the waveform at the first channel input 410 with cable 600 connected to the system 20 as shown in FIG. 6A is a delayed view of the waveform VB_Tran, which is equal to the waveform VB_Inc (or the output of the cable 600 with the input signal applied).

Accordingly, the transmitted response CblTF of cable 600 that has a characteristic impedance of approximately 50Ω can be determined from the above two measurements as follows:

$$CblTF=VB\_IncF/VA\_TranF \approx VB\_TranF/VC\_TranF \qquad (18)$$

Thus, in an embodiment, the transmitted response CblTF of cable 600 may be determined by applying the input signal to the cable 600 and measuring the output of the cable 600 (VB_Tran) with the first channel input 410, and applying the input signal to the first channel input 410 and measuring the input signal with the first channel input 410. The transmitted response of the cable 600 may then be characterized using the measured output of the cable 600 and the measured input signal.

Imperfections in the transmitted response of cable 600 can be removed from subsequent measurements made with cable 600 by applying a correction filter to the measured waveforms. Using the same frequency response IdealF as described above with respect to FIG. 1 and equation (11), a correction filter frequency response CblCF_F can be defined as follows:

$$CblCF\_F=IdealF/CblTF \qquad (19)$$

The correction filter frequency response CblCF_F can be converted to a correction filter impulse response CblCF_IR using an inverse fast Fourier transform (ifft) function as follows:

$$CblCF\_IR=ifft(CblCF\_F) \qquad (20)$$

The correction filter impulse response CblCF_IR may be low pass filtered and then re-sampled to any required filter sample rate, to provide a finite impulse response (FIR) correction filter CblCF FIR defined as follows, where re-sample changes the time between samples and Lowpass is a low pass filter:

$$CblCF\_FIR=\text{re-sample}(Lowpass(CblCF\_IR)) \qquad (21)$$

All subsequent outputs of cable 600 generated upon connection of cable 600 to any system or point may thus be corrected by filtering the measured waveform using the FIR correction filter.

All or part of the various process operations discussed above with reference to FIGS. 6A and 6B may be implemented using a processing device, configured to execute computer software for characterizing and correcting the response of the cable 600, together with a GUI for directing a user when to perform certain steps, such as connecting and disconnecting the cable 600 to enable the various measurements. The processing device may be included in the oscilloscope 400, or it may be a separate device, such as a PC or other test instrument. Details of the processing device and memory may be substantially the same as discussed above with reference to FIG. 1, and therefore will not be repeated.

The processing device may execute software code, including the GUI, stored on a computer readable storage medium in order to characterize and/or correct a response of the cable 600. For example, the GUI may initially instruct the user via a display to connect the cable 600 to a channel (e.g., via first channel input 410) of the oscilloscope 400. With the cable 600 connected, the processing device may measure an output of the cable 600, in response to an input signal applied to the cable 600, using the oscilloscope channel. The GUI may then instruct the user to disconnect the cable 600. With the cable 600 disconnected, the processing device may measure the input signal using the oscilloscope channel with the input signal applied to the oscilloscope channel via the first channel input 410. The processing device is then able to characterize a transmitted response of the cable 600 using the measured output of the cable 600 and the measured input signal. The processing device is also able to correct the transmitted response of the cable 600 by applying a correction filter based on an ideal frequency response and the transmitted response of the cable 600.

Figure 7:
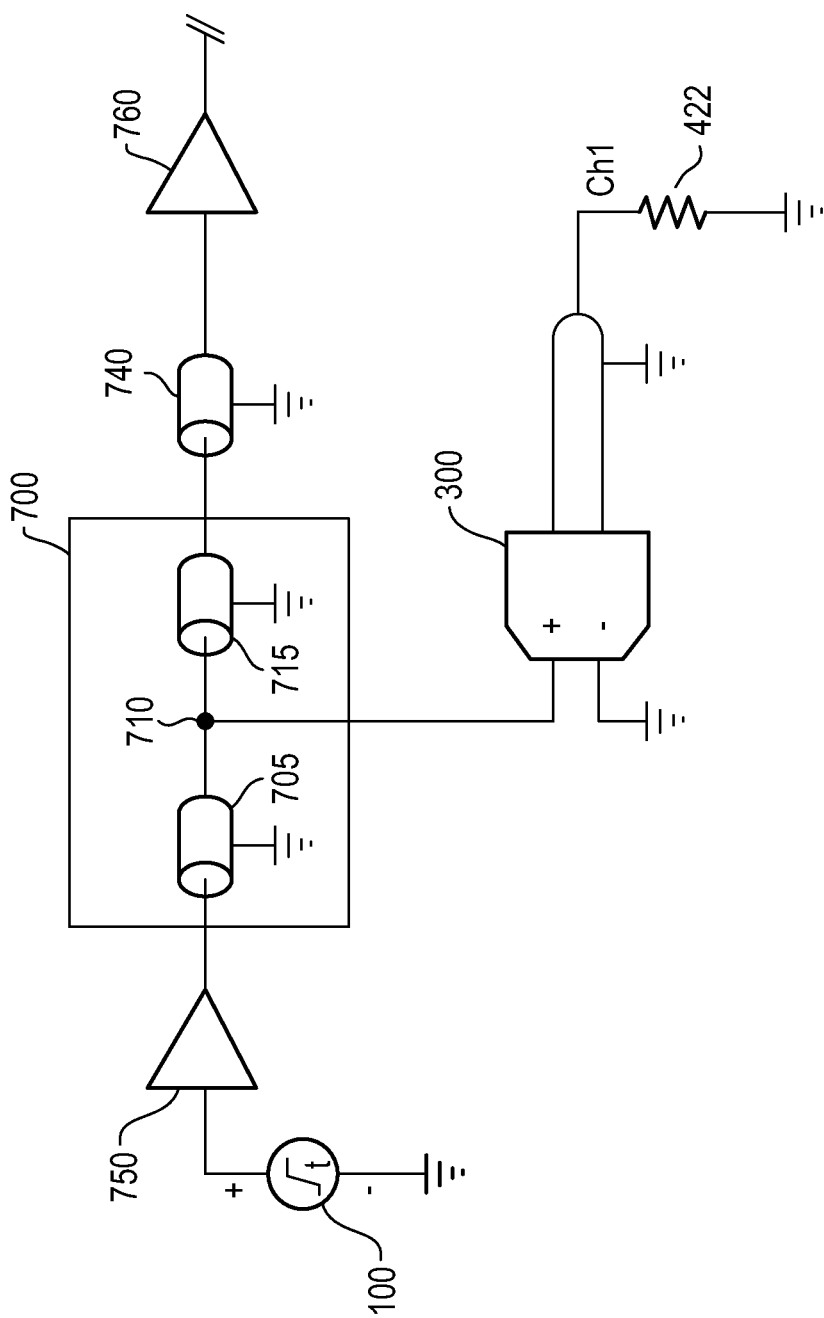
FIG. 7 is a block diagram illustrating an apparatus configured for measuring the output of a transmitter.

FIG. 7 is a block diagram illustrating an apparatus for making a typical measurement of the output of a transmitter with a voltage probe, according to a representative embodiment.

Referring to FIG. 7, voltage probe 300 is used to measure a signal output by transmitter 750 and received by receiver 760. Serial data from the transmitter 750 is output through package lead 705, PC board trace 715 and package lead 740, each of which has a 50Ω impedance, for example. The connection between the package lead 705 and the PC board trace 715 provides a physical location to which the voltage probe 300 is attached The voltage probe 300 is used to measure the output of the transmitter 750. When the voltage probe 300 has been characterized using the technique described above, the non-ideal response of the voltage probe 300 is corrected by applying a FIR correction filter (not shown) to waveforms that are output from the voltage probe 300, e.g., via the processing device discussed above, thus showing the true wave-shape of the signal being measured.

Figure 8:
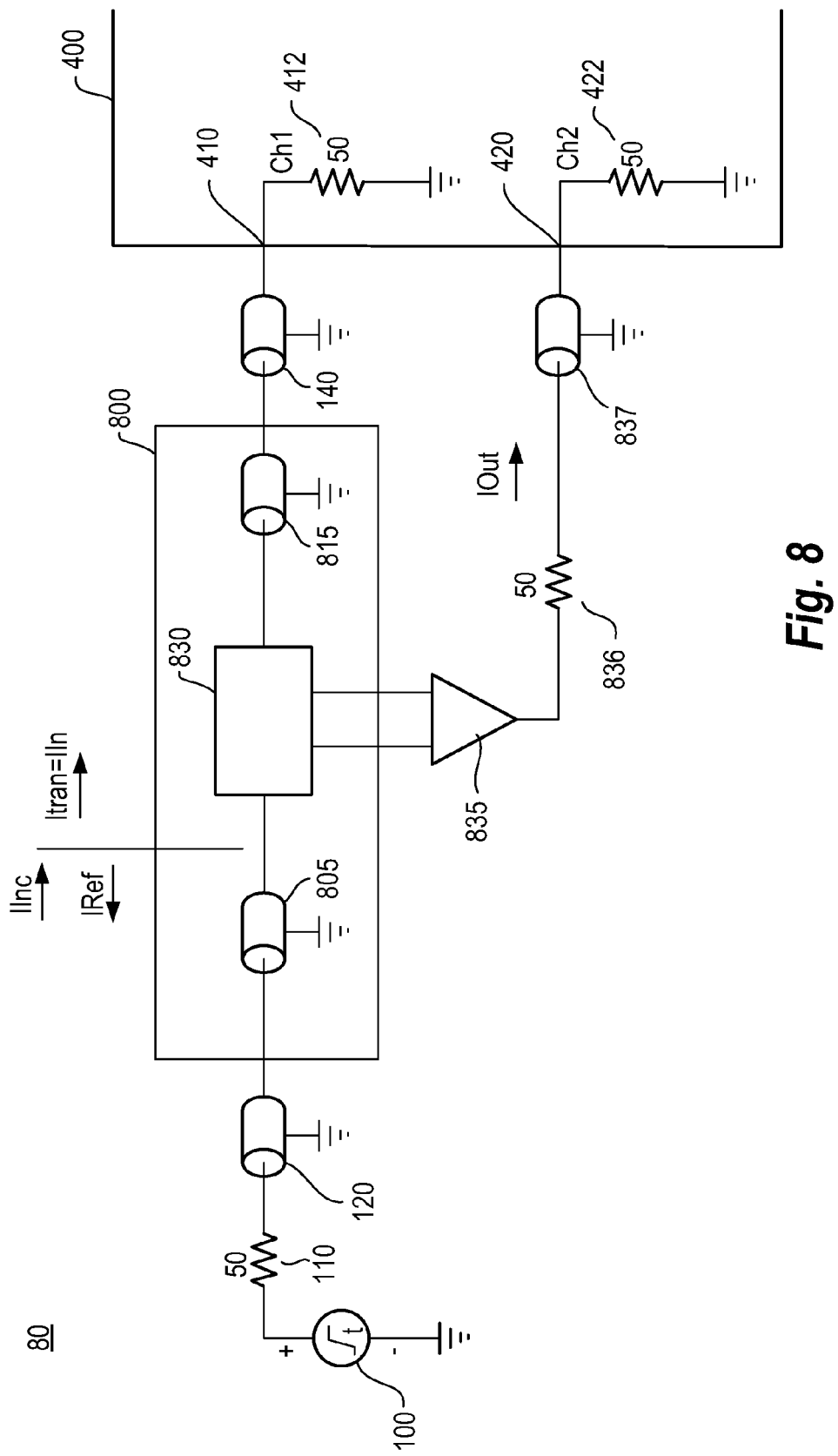
FIG. 8 is a block diagram illustrating a system for characterizing the input impedance and response of a current probe, according to a representative embodiment.

According to alternative embodiments, a system is similarly provided for characterizing input impedance and response of a current probe, as opposed to a voltage probe, and then correcting imperfections in the measured response of the current probe. FIG. 8 is a block diagram illustrating such a system, according to a representative embodiment. A first part of the procedure implemented by the system characterizes the input impedance and the response of the current probe, and a second part of the procedure corrects imperfections in the measured response of the current probe according to a representative embodiment.

As shown in FIG. 8, the system 80 includes signal generator 100 that generates an input signal having amplitude VSrc*2, and a 50Ω generator impedance indicated as resistance 110. As discussed above, the input signal may be a fast step signal or a fast impulse signal, for example. Also as discussed above, the signal generator 100 is connected as an input of transmission line 120, which in a representative embodiment may be a 50Ω cable, for example.

An output of the transmission line 120 is connected to an input of through 800, which may be a probeable 50Ω transmission line, for example. The step signal provided to through 800 has amplitude VSrc, which is half the amplitude of the step signal as output from signal generator 100. Through 800 includes a front-end transmission line 805 and a back-end transmission line 815, which may be 50Ω microstrip lines or traces, for example. Current probe 830 is inserted in series between the front-end and back-end transmission lines 805 and 815 of through 800. Current probe 830 may be any typical current probe, and may include a first point connected to the front-end transmission line 805 to receive a signal to be measured and a second point connected to the back-end transmission line 815. The output of through 800 is connected to transmission line 140, which may also be a 50Ω cable. The output of transmission line 140 is connected to the first channel input 410 of oscilloscope 400, and an output of current probe 830 is connected to second channel input 420 of oscilloscope 400 through representative active amplifier 835, shown as having a 50Ω current probe impedance indicated as resistance 836, and transmission line 837, also having 50Ω impedance, for example. Both the first and second channel inputs 410 and 420 of oscilloscope 400 may be terminated by 50Ω impedances as respectively denoted by resistances 412 and 422, discussed above.

Accordingly, current IIn flowing into the current probe 830 propagates into the first channel input 410 of the oscilloscope 400, and is therefore measured indirectly by measuring voltage VCh1 that is generated across the 50Ω termination resistance 412. Likewise, the current IOut output from the current probe 830 is measured indirectly by measuring voltage VCh2 that is generated across the 50Ω termination resistance 422. That is, the current IIn and the current IOut may be determined as follows:

$$IIn = VCh1/50\Omega \quad (22)$$

$$IOut = VCh2/50\Omega \quad (23)$$

In response to the step signal provided to through 800 via transmission line 120, three current waveforms of interest exist at the input of the current probe 830, each of which has a corresponding direction indicated by arrows in FIG. 8. The three current waveforms include incident current IInc, transmitted current ITran, and reflected current IRef. Of note, the input current IIn at the input of the current probe 830 is identical to the transmitted current ITran. Also, since the system 80 is a terminated 50Ω system, the current IOut output from transmission line 140 to the first channel input 410 is identical to the transmitted current ITran, except that it is delayed in time.

In accordance with the system shown in FIG. 8, in order to measure the input impedance of current probe 830, incident current IInc is first measured. This may be accomplished by initially removing the current probe 830 and measuring the incident current IInc indirectly by measuring the voltage VCh1 that the incident current IInc generates across the 50Ω termination resistance 412 of the first channel input 410, indicated as follows:

$$IInc = VCh1/50\Omega \quad (24)$$

In this case, the transmitted current ITran will be equal to the incident current IInc, and the reflected current IRef will be equal to zero. The current probe 830 is then connected to the through 800 (in series between the front-end and back-end transmission lines 805 and 815), and input current IIn and output current IOut responsive to the step signal are measured while current probe 830 is connected. In this representative embodiment, the measurements with current probe 830 disconnected from the through 800 are made before measurements made with current probe 830 connected in the through 800. However, it should be understood that in the alternative, the measurements with current probe 830 disconnected from the through 800 may be made after the measurements made with current probe 830 connected in the through 800, without departing from the scope of the present teachings.

The input impendence and frequency response of the current probe 830 can be determined by calculating the fft of the impulse response of each waveform measured by system 80, whereby impulse response is determined from the derivative of step response. Hence, the time domain measurement of incident current IInc responsive to the step signal while the current probe 830 is disconnected from the through 800, and the time domain measurements of input current IIn and output current IOut responsive to the step signal while current probe 830 is connected in the through 800, are converted to frequency domain quantities using substantially the same method discussed above with regard to the voltage probe 300. Thus, the following frequency domain quantities may be indicated as follows:

$$IIncF = fft(\text{derivative}(IInc)) \quad (25)$$

$$IInF = fft(\text{derivative}(IIn)) \quad (26)$$

$$IOutF = fft(\text{derivative}(IOut)) \quad (27)$$

Thereafter, denoting the input impedance of the current probe 830 to be ZInI and analyzing the system 80 shown in FIG. 8, the current IInF at the input of the current probe 830 may be represented as follows, where Zo is the characteristic impedance of the system 80 (in this case 50Ω):

$$IInF = IIncF * 2 * Zo/(2 * Zo + ZInI) \quad (28)$$

Solving Equation (28) for the input impedance ZInI of the current probe 830 provides as follows:

$$ZInI = 2*Zo*(IIncF/(IInF-1)) \tag{29}$$

Accordingly, the input impedance ZInI of the current probe 830 may be determined from the measured incident current IInc responsive to the step signal with the current probe 830 disconnected from the through 800, and the measured input current IIn in response to the step signal with the current probe 830 connected in the through 800. The input impedance ZInI of the current probe 830 can thus be characterized without the need of a VNA.

The response of current probe 830 may then be determined, as described below.

In general, in some cases, the user of a current probe might consider an ideal current probe to be one that faithfully reproduces the current at the input of the current probe while the current probe is loading the signal. Hence, the current waveform at the output of an ideal current probe is identical to the current waveform at the input of the ideal current probe, even if the current probe has non-ideal (non-zero) input impedance. In other cases, the user of a current probe may consider an ideal current probe to be one that compensates for loading of the current probe by boosting the transfer function of the current probe by the amount that the current probe loads the signal, thus producing a current waveform at the output of the current probe that is identical to the current waveform that is incident to the point being probed. Note that if the input impedance of the current probe is ideal (zero), the waveform of the incident current IInc is identical to the waveform of the input current IIn, and there is no difference between these two definitions of response.

The transfer function of a current probe IprbTF is, by definition, as follows:

$$IprbTF = IOutF/IInF \tag{30}$$

The transfer function of the current probe is completely defined by the properties of the current probe and is not affected by any characteristics of the system being probed. In contrast, the response from a so-called system standpoint (system response) SysTF is a function of both the properties of the current probe and the system being probed, and may be defined as follows:

$$SysTF = IOutF/ISrcF = IOutF/IIncF \tag{31}$$

More specifically, the voltage generated across the input impedance of the probe is subtracted from the voltage that drives the load, and hence the current into the load is reduced. This is commonly referred to as loading the signal being probed, similar to the voltage probe case, discussed above.

In terms of the probe transfer function IprbTF, the system response SysTF may be defined as follows:

$$SysTF = IOutF/IIncF = IprbTF*IInF/IIncF \tag{32}$$

After solving for IInF/IIncF in equation (28), and substituting accordingly into equation (32), the system response SysTF may be simplified as follows:

$$SysTF = IprbTF*2*Zo/(2*Zo+ZInI) \tag{33}$$

When the input impedance of a current probe is ideal (zero), the waveform that is incident to the current probe is identical to the waveform that appears at the input of the current probe, and thus there is no difference between these two responses, i.e., between the current probe transfer function and the system response. Accordingly, as may be seen from the above, the input impedance and response of the current probe 830 may be characterized by three measurements, including the measured incident current IInc, input current IIn, and output current IOut.

In order to accommodate whichever definition of response that a user of a current probe might want to idealize with the above characterization and correction procedure, either of the above two responses can be calculated and corrected. Either the transfer function of the current probe IOut/IIn can be made to be ideal, or the system response IOut/IInc=IOut/ISrc can be made to be ideal. Regardless of which response is to be corrected, it is necessary to consider and define the shape of an ideal frequency response IdealF. Defining the ideal frequency response IdealF is the same as discussed above with respect to the voltage probe, and therefore will not be repeated.

Given the ideal frequency response IdealF, a correction filter may be calculated in one of two ways, depending on which definition of response the user would like to correct. For example, if correcting the transfer function of the current probe, IprbTF=IOut/IIn, then the correction filter frequency response is as follows:

$$IprbCF\_F = IdealF/IprbTF = IdealF*IInF/IOutF \tag{34}$$

If correcting the response of a probed system with 2*Zo=100 Ohm source impedance, for example, the correction filter frequency response is as follows:

$$IprbCF\_F = IdealF*IIncF/IOutF \tag{35}$$

Also, if correcting the response of a probed system with an arbitrary source impedance, where ZSrc=2*Zo, the correction filter frequency response is as follows:

$$IprbCF\_F = IdealF/IprbTF*(2*Zo+ZInI)/2*Zo \tag{36}$$

The remaining tasks of low pass filtering, calculating the correction filter frequency response, and converting the correction filter to an FIR filter are substantially the same as discussed above with respect to the voltage probe, and therefore will not be repeated.

All or part of the various process operations discussed above may be implemented using a processing device, configured to execute computer software for characterizing and correcting the response of the current probe 830, together with a GUI for directing a user when to perform certain steps, such as connecting and disconnecting the current probe 830 to enable the various measurements. The processing device may be included in the oscilloscope 400, or it may be a separate device, such as a PC or other test instrument. Details of the processing device and memory may be substantially the same as discussed above with reference to FIG. 1, and therefore will not be repeated.

The processing device may execute software code, including the GUI, stored on a computer readable storage medium in order to characterize and/or correct a response of the current probe 830. For example, the GUI may initially instruct the user via a display to connect the current probe 830 to the through 200 in series. With the current probe 830 connected, the processing device may measure output current of the current probe 830 and first output current of the through 200, in response to an input signal being applied to the through 200. The GUI may then instruct the user to disconnect the current probe 830 from the through 200. With the current probe 830 disconnected, the processing device may measure second output current of the through 200 in response to the input signal. The processing device is then able to characterize the response of the current probe 830, e.g., by determining a transfer function of the current probe 830, using the measured output current of the current probe 830 and at least one of the measured first output current and the measured second output current of the through 200. The processing device may similarly correct the response of the current probe 830, for example, by generating a filter correction for the current probe 830 responsive to the measured output current of the current probe 830 and the measured first output of the through 200, and applying the filter correction to an output of the current probe 830 generated in response to connection of the current probe 830 to a device or a system to measured.

The representative embodiments described above provide easy to use techniques for characterizing input impedance and response of any voltage probe or current probe. Easy to use techniques are also provided for correcting imperfections in the response of the voltage probe or current probe. The techniques allow flexibility with respect to the manner in which the voltage and current probe responses may be defined, and also the amount of boosting that is allowed, in order to correct the voltage and current probe responses. The techniques enable correction of a probe response in systems with arbitrary complex source impedance. For users of real-time oscilloscopes, for example, which provide a fast calibration step, no additional equipment and/or external simulators are required.

While specific embodiments are disclosed herein, many variations are possible, which remain within the concept and scope of the present teachings. For example, in an alternative embodiment, oscilloscope 400 in system 10 shown in FIG. 1 may be configured to trigger in response to a stored copy of a step pulse rather than the inputs provided to the first and second channel inputs 410 and 420, to improve triggering. Such variations would be apparent in view of the specification, drawings and claims herein.

What is claimed is:

1. A method for at least one of characterizing and correcting a response of a voltage probe, the method comprising:
    measuring an output of the voltage probe and a first output of a through, in response to an input signal applied to the through, with the voltage probe physically connected to a probe point of the through, the voltage probe comprising a first point that makes physical contact with a signal to be measured and a second point that makes physical contact to ground;
    measuring a second output of the through in response to the input signal, with the voltage probe disconnected from the probe point;
    characterizing the response of the voltage probe, comprising determining a transfer function of the voltage probe based on the measured output of the voltage probe and the measured first output of the through; and
    correcting the transfer function of the voltage probe, comprising:
        generating a filter correction for the voltage probe responsive to the measured output of the voltage probe and the measured first output of the through, wherein generating the filter correction comprises defining an ideal frequency response of the voltage probe, the filter correction comprising the ideal frequency response divided by the transfer function of the voltage probe; and
        applying the filter correction to an output of the voltage probe generated in response to connection of the voltage probe to a probed system.

2. A method for at least one of characterizing and correcting a response of a voltage probe, the method comprising:
    measuring an output of the voltage probe and a first output of a through, in response to an input signal applied to the through, with the voltage probe connected to a probe point of the through;
    measuring a second output of the through in response to the input signal, with the voltage probe disconnected from the probe point; and
    characterizing the response of the voltage probe using the measured output of the voltage probe and at least one of the measured first output and the measured second output of the through,
    wherein characterizing the voltage probe comprises determining an input impedance of the voltage probe based on the measured first output of the through with the probe connected and the measured second output of the through with the probe disconnected.

3. The method as claimed in claim 2, further comprising:
    correcting a system response of a probed system using the determined input impedance of the voltage probe.

4. The method as claimed in claim 3, wherein correcting the system response of the probed system comprises:
    generating a filter correction for the voltage probe responsive to the determined input impedance of the voltage probe; and
    applying the filter correction to an output of the voltage probe generated in response to connection of the voltage probe to the probed system.

5. The method as claimed in claim 2, wherein the input signal comprises one of a fast step signal and a fast impulse signal.

6. The method of claim 2, wherein measuring the first and second outputs of the through is performed using a first oscilloscope channel, and measuring the output of the voltage probe is performed using a second oscilloscope channel.

7. The method as claimed in claim 2, wherein the input signal comprises one of a fast step signal and a fast impulse signal.

8. The method of claim 2, wherein measuring the first and second outputs of the through is performed using a first oscilloscope channel, and measuring the output of the voltage probe is performed using a second oscilloscope channel.

9. A method for at least one of characterizing and correcting a response of a current probe, the method comprising:
    measuring output current of the current probe and first output current of a through, in response to an input signal applied to the through with the current probe physically connected in series between front-end and back-end transmission lines of the through;
    measuring second output current of the through in response to the input signal, with the current probe disconnected from the through;
    characterizing the response of the current probe, using comprising determining a transfer function of the current probe based on the measured output current of the current probe and the measured first output current of the through; and
    correcting the transfer function of the current probe, comprising:
        generating a filter correction for the current probe responsive to the measured output current of the current probe and the measured first output of the through, wherein generating the filter correction comprises defining an ideal frequency response of the current probe, the filter correction comprising the ideal frequency response divided by the transfer function of the current probe; and applying the filter correction to an output of the current probe generated in response to connection of the current probe to a probed system.

10. A method for at least one of characterizing and correcting a response of a current probe, the method comprising:

measuring output current of the current probe and first output current of a through, in response to an input signal applied to the through with the current probe physically connected in series between front-end and back-end transmission lines of the through;

measuring second output current of the through in response to the input signal, with the current probe disconnected from the through; and characterizing the response of the current probe using the measured output current of the current probe and at least one of the measured first output current and the measured second output current of the through, wherein characterizing the current probe comprises determining an input impedance of the current probe based on the measured first output current of the through with the current probe connected and the measured second output current of the through with the current probe disconnected.

11. The method as claimed in claim 10, further comprising:

correcting a system response of a probed system using the determined input impedance of the current probe.

12. The method as claimed in claim 10, wherein the input signal comprises one of a fast step signal and a fast impulse signal.

13. The method of claim 10, wherein measuring the first and second output currents of the through is performed using a first oscilloscope channel, and measuring the output of the current probe is performed using a second oscilloscope channel.

* * * * *